(12) United States Patent
Stoll et al.

(10) Patent No.: US 7,627,303 B2
(45) Date of Patent: Dec. 1, 2009

(54) SIGNAL DOWNCONVERTER

(75) Inventors: Thomas Stoll, Hohenems (AT); Peter Widerin, Hoerbranz (AT)

(73) Assignee: Wipro Limited, Bangalore, Karnataka (IN)

( * ) Notice: Subject to any disclaimer, the term of this patent is extended or adjusted under 35 U.S.C. 154(b) by 479 days.

(21) Appl. No.: 11/468,310

(22) Filed: Aug. 30, 2006

(65) Prior Publication Data
US 2008/0057901 A1  Mar. 6, 2008

(51) Int. Cl.
*H04B 1/26* (2006.01)
(52) U.S. Cl. ............ 455/313; 455/226.1; 455/323
(58) Field of Classification Search ............ 455/313, 455/318, 226.1, 115.1, 323, 334, 341
See application file for complete search history.

(56) References Cited

U.S. PATENT DOCUMENTS

| | | | | |
|---|---|---|---|---|
| 6,615,027 | B1* | 9/2003 | Sahota et al. | 455/91 |
| 7,027,793 | B2* | 4/2006 | Gard et al. | 455/318 |

\* cited by examiner

*Primary Examiner*—Tony T Nguyen
(74) *Attorney, Agent, or Firm*—Prakash Nama; Global IP Services, PLLC

(57) ABSTRACT

A signal downconverter having a pair of passive double sideband mixers for receiving quadrature RF signals and mixing the same with local oscillator driving signals to provide mixed differential signals. The mixed differential signals are fed to a differential difference feedback amplifier high frequency ripples are eliminated and finally providing a down converted output signal.

16 Claims, 7 Drawing Sheets

SIGNAL DOWNCONVERTER

FIELD OF INVENTION

This invention generally relates to a radio transceiver. More specifically, it relates to a single sideband mixer for down converting radio frequency signals.

BACKGROUND

Signal mixers are widely used in radio transceivers for wireless applications including telemetry systems, wireless Local Area Networks, and communication devices such as radios, cellular telephones and other radio frequency (RF) devices. There are two types of mixer, a passive mixer and an active mixer. A mixer may be either passive or active according to the mixer's ability to provide gain or not. A passive mixer is based on an un-biased configuration (i.e. no gain) and it generally exhibits a poor noise figure but a desirably high linearity over a relatively wide dynamic frequency range. The use of negative feedback configurations to amplify and buffer weak signals from the passive mixer is commonly used in integrated circuit applications. However, in such architectures, the feedback is connected directly to the input stages of the operational amplifier and therefore has an impact on the mixer stages. In contrast, an active mixer, such as a Gilbert cell mixer, has good gain and noise figure. However, active mixers have relatively poor linearity. In order to increase the linearity, increased bias current is needed which leads to increased power consumption. This is not desirable in modern day devices where the devices are typically small in size (heating issue) and operate on rechargeable batteries (limited power).

In wireless applications, the transmitted and received signal is an RF signal. The RF signal consists of a baseband signal, which is a relatively low frequency signal, modulated on a relatively high frequency signal commonly known as a carrier frequency signal. Mixers are used in transceivers to convert a low frequency signal (e.g. baseband signal) to a high frequency signal or a high frequency signal (e.g. RF signal) to a low frequency signal by mixing the signal with a local oscillator signal. Therefore, the outputs from a mixer are the sum ($f_{RF}+f_{LO}$) or the difference ($f_{RF}-f_{LO}$ or $f_{LO}-f_{RF}$) of the input frequencies signals. In the case of a downconversion, the output signals from the mixer are then passed through a filter to remove unwanted frequencies before sending the filtered signal (which is typically a baseband signal) to an information recovery module.

Individually, current passive and active mixers are unable to provide high linearity, low power consumption and good noise figures. As such, it is desirable to provide a signal downconverter that provides the linearity of a passive mixer, gain control and a good noise figure of an active mixer and low power consumption.

SUMMARY OF THE INVENTION

A signal downconverter for down converting RF signals is disclosed. The signal downconverter includes a mixing stage for mixing the RF signals with local oscillator driving signals to provide mixed differential signals, and an amplifying stage coupled to the mixing stage for receiving the mixed differential signals and further processing the same to provide a down converted signal free of unwanted signals. The mixing stage includes two double sideband mixers arranged to receive and mix quadrature signals to provide the mixed differential signals. The amplifying stage includes a differential difference feedback amplifier having a differential input stage for receiving and processing the mixed differential signals and a high gain stage. The differential difference feedback amplifier also includes a gain setting circuit acting as a negative feedback loop coupling the outputs from the high gain stage to the differential input stage.

BRIEF DESCRIPTION OF THE DRAWINGS

Embodiments of the invention are herein described, purely by way of example, with references made to the accompanying drawings, in which.

DETAILED DESCRIPTION OF THE INVENTION

A signal downconverter having high linearity, good noise figure, image rejection, controllable gain and low power consumption is described hereinafter with reference to the drawings. Examples and embodiments herein are provided by way of explanation only and are not to be taken as limiting to the scope of the invention. It will be understood that the present invention covers these embodiments as well as variations and modifications thereto that would be understood by a person skilled in the art.

Figure 1A:
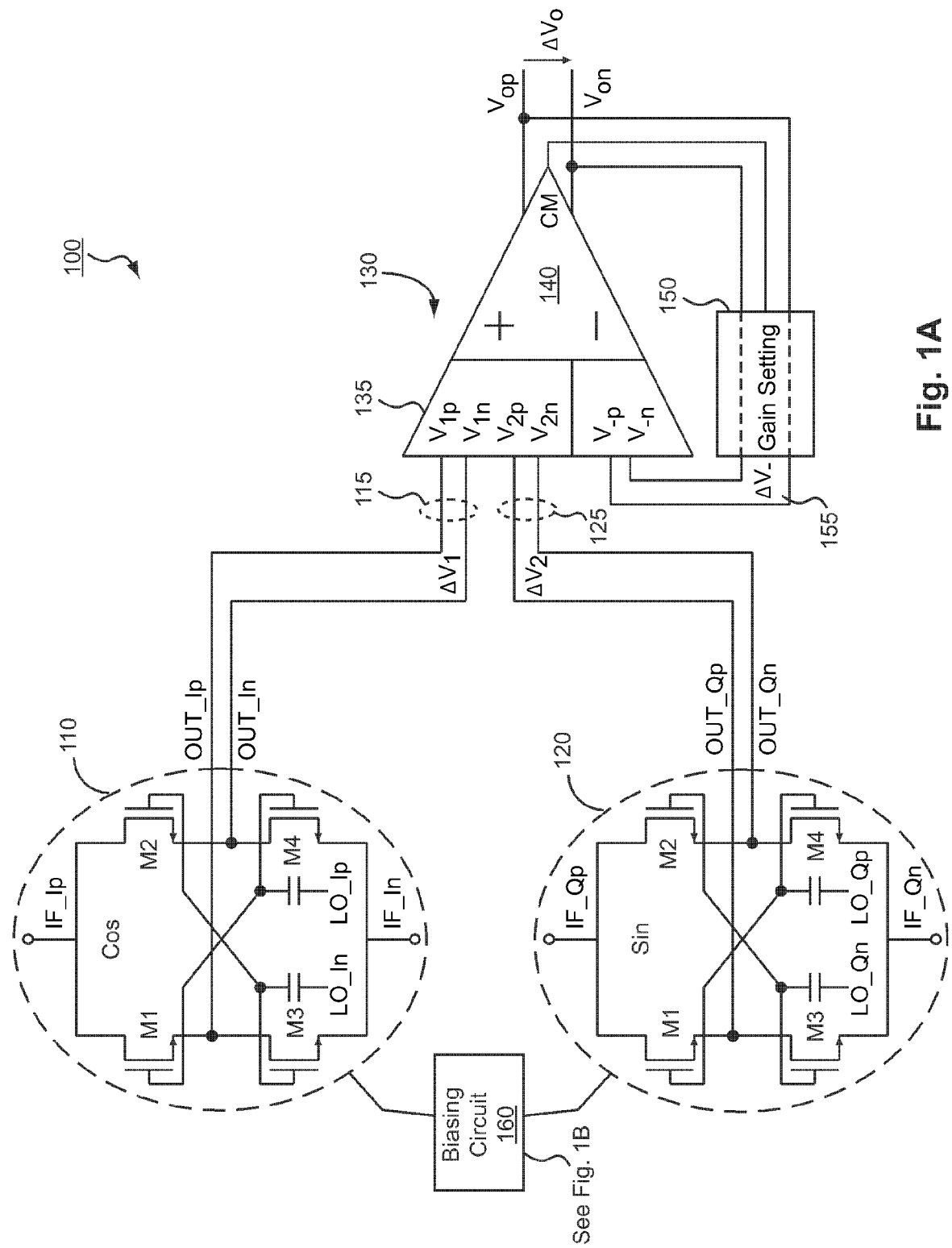
FIG. 1A shows a schematic diagram of a signal downconverter according to an embodiment of the present invention.

FIG. 1A shows a schematic diagram of a signal downconverter 100 according to an embodiment of the present invention. The signal downconverter 100 includes two mixers 110, 120 configured to receive and mix quadrature (I and Q channels) signals. The outputs from the two mixers 110, 120 (mixed signals) are fed to a differential difference feedback amplifier (DDFA) 130 for further processing. The DDFA 130 includes a differential input stage 135, a high gain stage 140 and a gain setting circuit 150.

Each of the two mixers 110, 120 is a passive double sideband mixer providing high linearity differential input signals mixing. In this exemplary embodiment, the passive double sideband mixer is constructed using four N-channel metal oxide semiconductor (NMOS) field effect transistors (FETs), M1, M2, M3 and M4 arranged in a ring configuration as shown in FIG. 1A. It should be noted that with appropriate biasing, P-channel metal oxide semiconductor (PMOS) FETs can be used in place of the NMOS FETs. Considering mixer 110, the drain terminals of FETs M1 and M2 are coupled together for receiving an I-channel intermediate frequency, IF_Ip, signal, while the source terminals of FETs M3 and M4 are coupled together for receiving a complementary (out of phase by 180 degrees) I-channel intermediate frequency, IF_in, signal. The source terminals of M1 and M2 are coupled to the respective drain terminals of M3 and M4. The signals passing through FETs M1 and M4 are mixed with a local oscillator driving signal, LO_Ip, provided to the gate terminals of FETs M1 and M4. Similarly, the signals passing through FETs M2 and M3 are mixed with a complementary local oscillator driving signal, LO_In, provided to the gate terminals of FETs M2 and M3. During operation, the drain source bias of each of the four FETs is approximately equal to a threshold voltage ($V_{th}$) so that each FET operates in the linear region. As mixer 110 is for processing I-channel signals, it is also referred to as a cosine mixer. The operation and connections of the FETs of mixer 120 are similar to that of mixer 110, but for the fact that mixer 120 is for processing Q-channel intermediate frequency signals, IF_Qp and IF_Qn. Accordingly, mixer 120 is also referred to as a sine mixer.

Figure 1B:
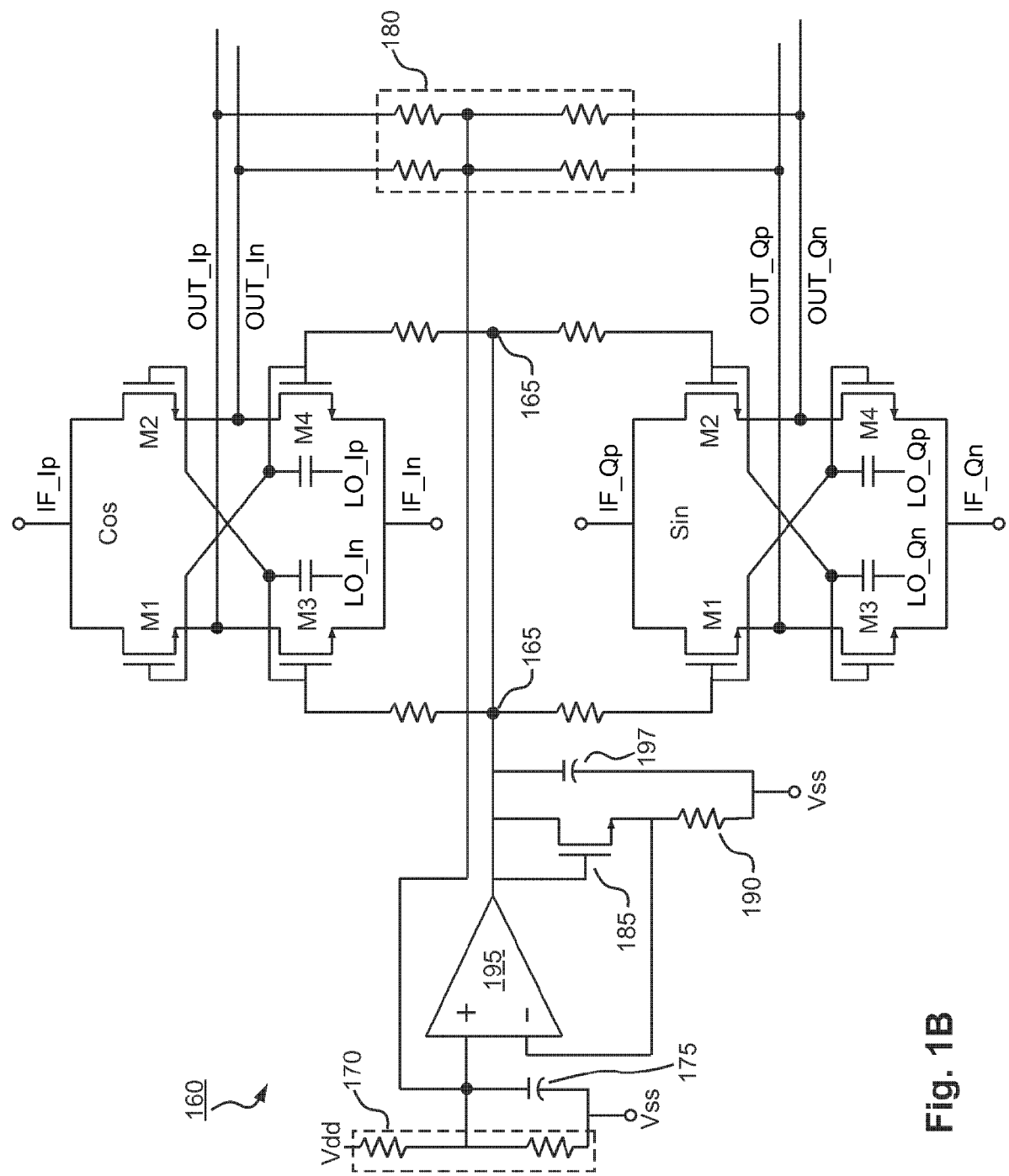
FIG. 1B shows a schematic diagram of a mixer biasing circuit according to an embodiment of the present invention.

Each of the FETs also has a fourth terminal for used as a bulk connection (not shown). The bulk connection is typically connected to a low voltage, typically a ground level voltage, $V_{SS}$, being the lowest voltage on an integrated circuit. Further, a biasing circuit 160 coupling the two mixers 110, 120 can be provided for biasing the mixers 110, 120 for proper operation. An exemplary schematic diagram of the biasing circuit 160 according to an embodiment is shown in FIG. 1B.

The biasing circuit 160 takes a reference voltage from a voltage divider 170, typically, half of $V_{DD}$. The capacitor 175 at the divided voltage is to remove high frequency ripples that can be on top of $V_{DD}$. The voltage divider 170 also sets the common mode of the mixers (110, 120) outputs via four resistors 180. In order to have the mixer transistors operating in the linear region, the local oscillators are biased to be at substantially one threshold voltage above this common mode voltage. This is achieved by putting a NMOS FET 185 operating as a diode together with a resistor 190 into the feedback path of an operation amplifier 195. Therefore the output 165 is substantially one threshold voltage on top of the biasing for the mixers outputs. The capacitor 197 is provided to remove high frequency ripples.

The outputs of each mixer 110 and 120 have a high frequency component (i.e. the sum of the two input angular frequencies, $\omega=\omega_1+\omega_2$) and a low frequency component (i.e. the difference of the two input angular frequencies, $\Delta\omega=\omega_1-\omega_2$). The multiplication of the two I-channel input signals in the cosine mixer 110 produces positive cosine terms at the sum frequency and difference frequency. The multiplication of the two Q-channel input signals in the sine mixer 120 also produces a positive cosine term at the difference frequency but a negative cosine term at the sum frequency. The output signals (mixed signals) from the two mixers 110, 120 are expressed as follows:

OUT_$Ip$=cos($\omega t$)+cos($\Delta\omega t$)

OUT_$In$=−cos($\omega t$)−cos($\Delta\omega t$)

OUT_$Qp$=−cos($\omega t$)+cos($\Delta\omega t$)

OUT_$Qn$=cos($\omega t$)−cos($\Delta\omega t$)  (1)

Figure 2:
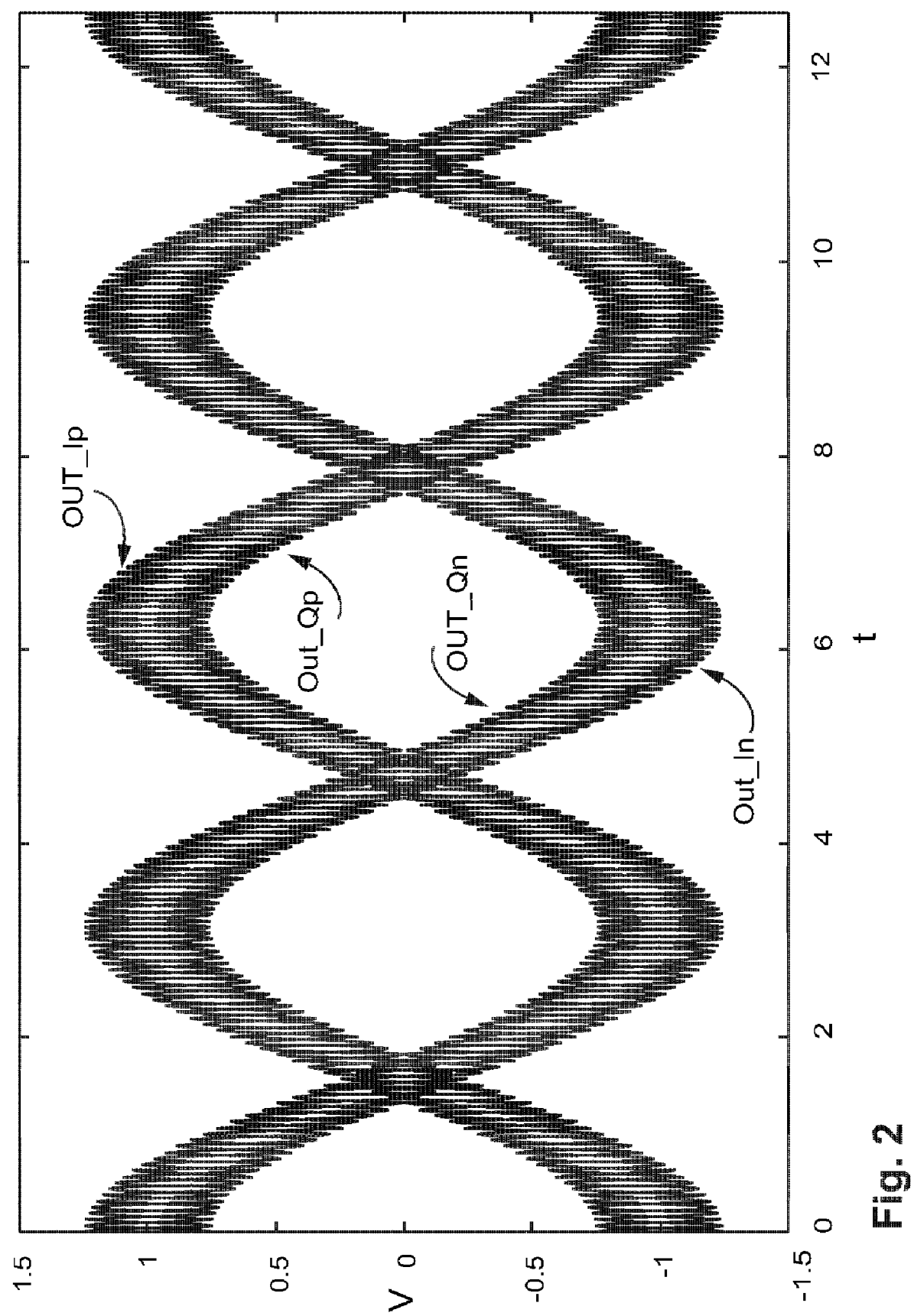
FIGS. 2 and 3 show examples of waveforms of output signals from mixers of the signal downconverter of FIG. 1A.
Figure 3:
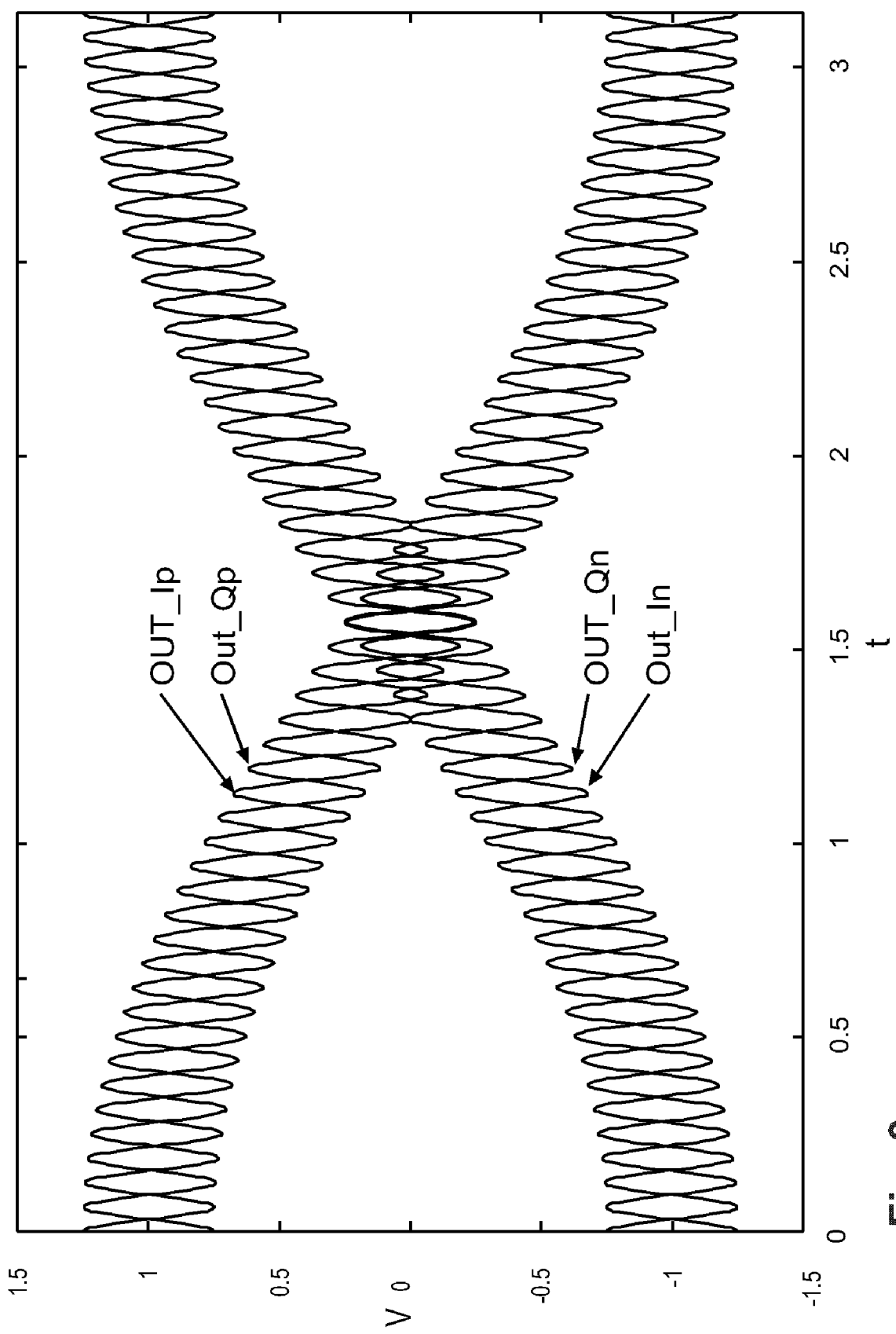

FIGS. 2 and 3 show the waveforms of the mixed signals. As can be seen from the waveforms, each of these mixed signals has a low frequency oscillation with high frequency ripples on top of it. The low frequency component of each of the mixed signals can be ready seen in FIG. 2, while the high frequency component of each of the mixed signals can be seen in FIG. 3, which is a zoomed view of the waveforms in FIG. 2. The high frequencies (unwanted and image frequency signals) are removed by vector cancellation rather than conventional filtering at the output stage of the mixers. The vector cancellation is performed by the differential input stage 135 of the DDFA 130 as described hereinafter.

Figure 4A:
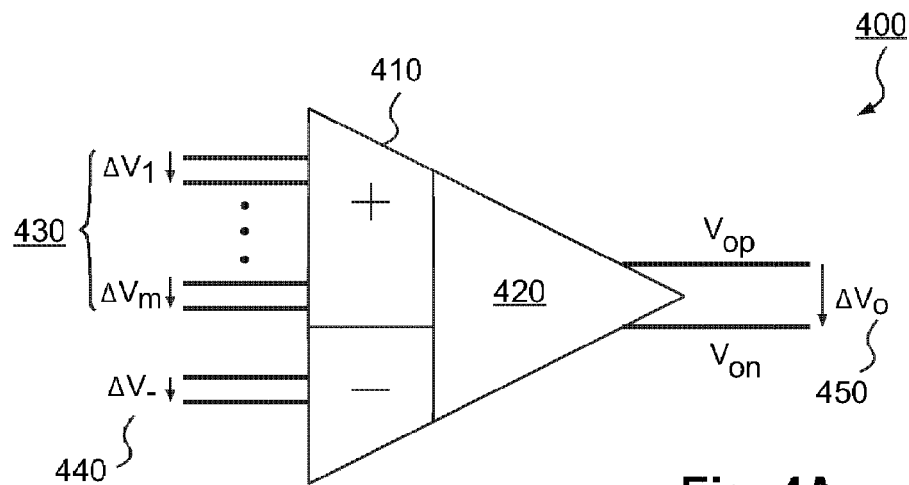
FIGS. 4A and 4B show block diagrams of a differential difference feedback amplifier according to an embodiment of the present invention.
Figure 4B:
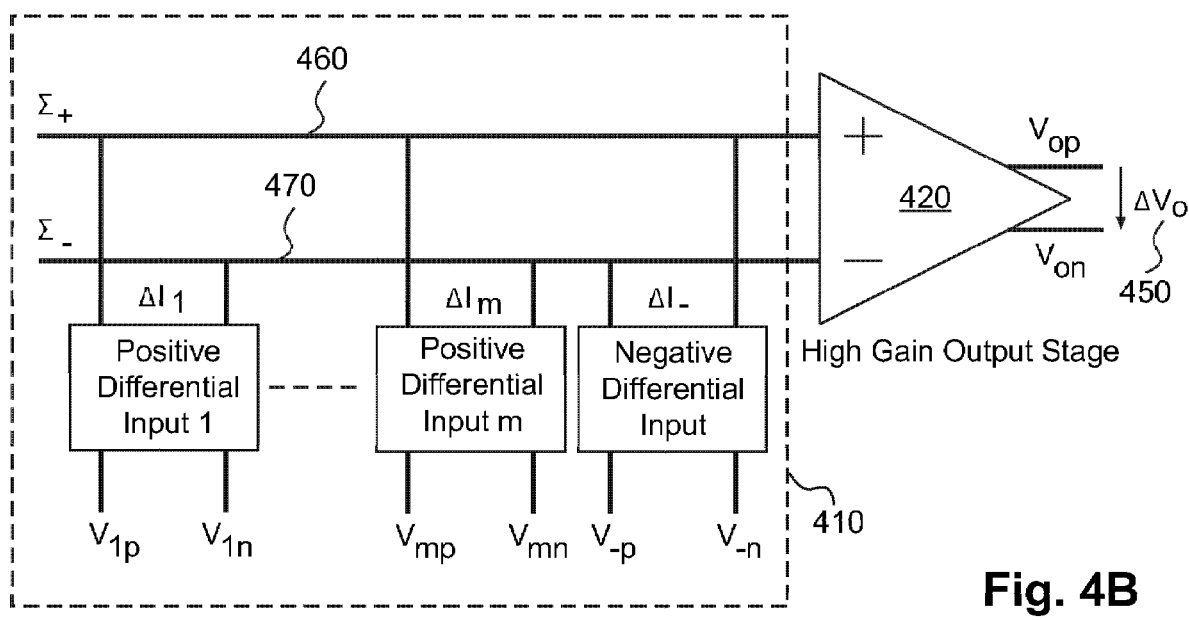

By way of an introduction to the DDFA 130, FIGS. 4A and 4B show block diagrams of a general differential difference amplifier (DDA) 400 upon which the DDFA 130 is based. FIG. 4B is a decomposed block diagram of the DDA 400 of FIG. 4A. The DDA 400 includes a differential input stage 410 and a high gain output stage 420 as shown. At the differential input stage 410, multiple positive differential input voltages 430 are provided. These multiple positive differential input voltages 430 are subsequently converted into corresponding multiple differential input currents ($\Delta I_1 \ldots \Delta I_m$) and are coupled to current summing buses 460, 470 (differential current summing bus) as shown in FIG. 4B. Also provided at the differential input stage 410 is a differential input voltage ($\Delta V-$) 440 acting as a negative differential input voltage relative to the multiple differential input voltages 430. Similarly, the negative differential input voltage 440 is converted into a corresponding negative differential input current, $\Delta I-$, and is coupled to the current summing buses 460, 470 in the opposite order to the multiple differential input currents as shown in FIG. 4B. Thus, the differential output 450 of the DDA 400 as a function of the differential input voltages 430, 440 and the amplification A by the high gain output stage 420 is given by:

$$\Delta V_o = A[\Delta V_1 + \Delta V_2 \ldots + \Delta V_m - \Delta V]$$  (2)

Therefore, changing the value of the negative differential input voltage 440 effects the overall differential output $\Delta V_o$ 450.

In an embodiment, the DDA 400 having two positive and one negative differential input voltages is used in the implementation of the DDFA 130 of FIG. 1A. The two positive differential input voltages are the output signals from the two mixers 110 and 120. The outputs from the cosine mixer 110 form a first differential input voltage ($\Delta V_1$) 115 and the outputs from the sine mixer 120 form a second differential input voltage ($\Delta V_2$) 125. Since the sum frequency terms have opposite signs, the common mode rejection of the current buses cancel these terms and leave only the difference (low) frequency terms. The resultant vector after the summations of equation (1) at the input of the high gain stage 140 is:

$$\Delta V_1 + \Delta V_2 = 4\cos(\Delta\omega t)$$  (3)

Therefore, the output stage (amplifier) 140 only needs to amplify the low frequency components of the mixed signals. Since the DDFA 130 only needs to operate at low frequencies, it simplifies the design of the amplifier and reduces current consumption.

Figure 5:
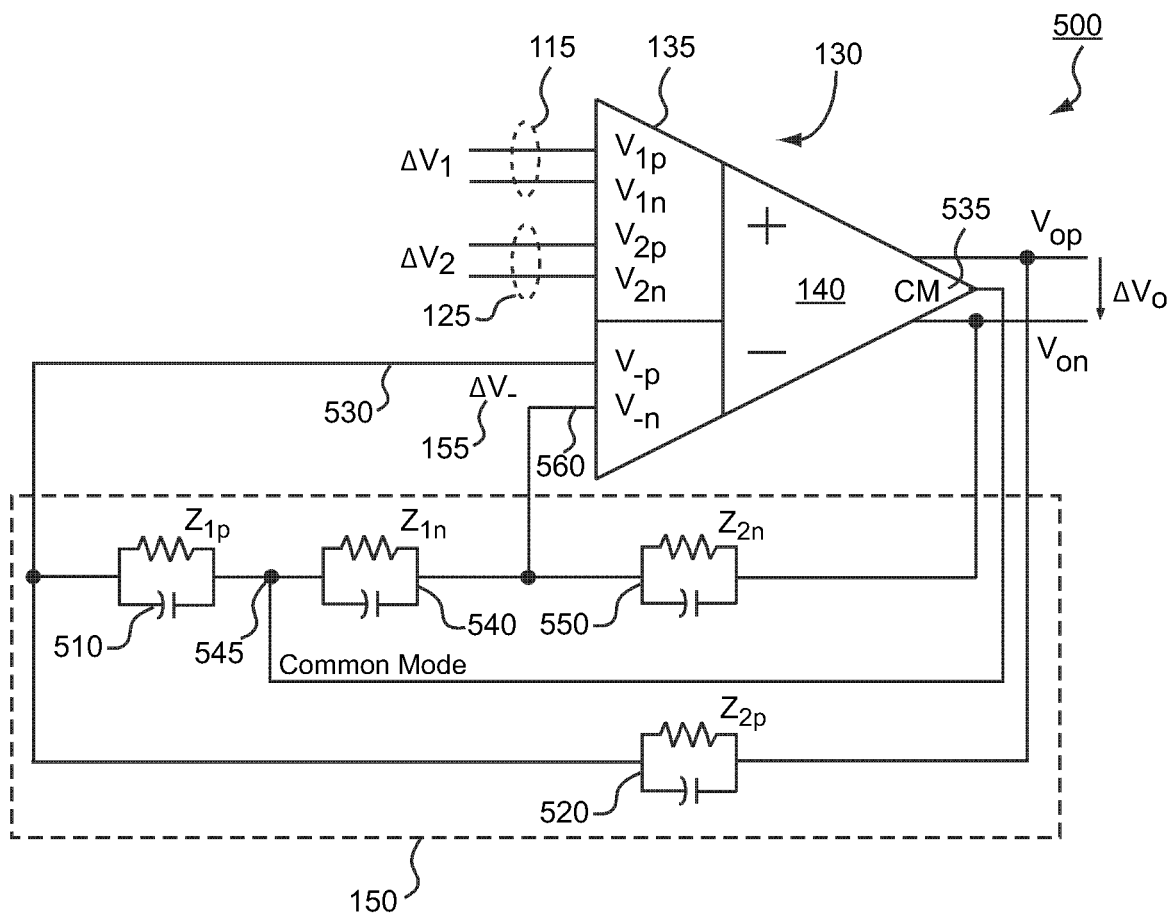
FIG. 5 shows an exemplary schematic diagram for implementing the gain setting circuit of the differential difference feedback amplifier of the signal downconverter of FIG. 1A.

The negative differential input voltage ($\Delta V-$) 155, a voltage between $V_{-p}$ and $V_{-n}$, is provided by the gain setting circuit 150. FIG. 5 shows an exemplary schematic diagram 500 for implementing the gain setting circuit 150 that acts as a passive (negative) feedback loop for the DDFA 130. The gain setting circuit 150 is a voltage divider constructed using passive components, which offer the best linearity. Typically, a voltage divider has two impedances, $Z_1$ and $Z_2$. In this exemplary embodiment, the voltage divider is made up of two pairs of identical impedances, namely impedances $Z_{1p}$ 510 and $Z_{2p}$ 520, and impedances $Z_{1n}$ 540 and $Z_{2n}$ 550 as seen in FIG. 5. In an embodiment, each impedance is a resistor. In an alternative embodiment, each impedance is a resistor arranged in parallel with a capacitor (as shown in FIG. 5), which has resistive behaviour for low frequency signals and capacitive behaviour for high frequency signals.

The first pair of impedances 510, 520 ($Z_{1p}$, $Z_{2p}$) connected in series is used for providing a positive voltage 530 of the negative differential input $\Delta V-$ 155. The positive output, $V_{op}$, from the amplifier is connected to the free end of impedance $Z_{2p}$ 520 and the free end of the impedance $Z_{1p}$ 510 is connected to a common mode output 535 of the amplifier. The positive voltage 530 of the negative differential input is tapped from the voltage between impedances $Z_{1p}$ 510 and $Z_{2p}$ 520 as shown in FIG. 5.

The second pair of impedances 540, 550 ($Z_{1n}$, $Z_{2n}$) connected in series is used for providing a negative voltage 560 of the negative differential input ΔV− 155. The negative output, $V_{on}$, from the amplifier is connected to the free end of impedance $Z_{2n}$ 550 and the free end of the impedance $Z_{1n}$ 540 is connected to the common mode output 535 of the amplifier. The negative voltage 560 of the negative differential input is tapped from the voltage between impedances $Z_{1n}$ 540 and $Z_{2n}$ 550 as shown in FIG. 5.

The connection node 545 between impedances $Z_{1p}$ and $Z_{1n}$ is coupled to the common mode output 535 of the amplifier 140. Generally, this is not necessary since, due to the symmetry of the (overall) voltage divider 150, the common mode of the negative differential input ΔV− 155 and the common mode of the differential output $ΔV_o$ are both the same. That is, $(V_{op}+V_{on})/2$ is equals to $(V_{-p}+V_{-n})/2$. As such, the connection node 545 can be left floating (i.e. not connected to anything). However, in the case where the impedances of the voltage divider are high, the connection node 545 (symmetry point) is a high impedance node, which is sensitive to noise disturbances, such as the effects of crosstalk, from adjacent circuit traces. Therefore, for added precaution, the connection node 545 is tied to a strong signal. In this embodiment, the connection node 545 is coupled to the common mode output 535 in order to provide additional common mode setting for the negative differential input ΔV− 155.

With the foregoing feedback arrangement, the magnitude of the differential output voltage $ΔV_o$ divided by the sum of the two pairs of impedances is the same as the magnitude of the differential feedback input voltage ΔV− divided by the sum of the two impedances 520, 550 ($Z_{2p}$, $Z_{2n}$) between the feedback inputs. However, the whole gain setting circuit 150 can be treated as one voltage divider having impedances $Z_1$ and $Z_2$, since it divides the differential output voltage $ΔV_o$ into the differential input voltage ΔV−. Accordingly, both $Z_{1p}$ and $Z_{1n}$ have the value $Z_1$, and $Z_{2p}$ and $Z_{2p}$ have the value $Z_2$.

Referring back to FIG. 1A, assuming a very high gain amplifier 140 and a feedback provided by a voltage divider having overall impedances $Z_1$ and $Z_2$, the total impedance between $V_{op}$ and $V_{on}$ is $2(Z_1+Z_2)$ (i.e. $Z_{1p}+Z_{1n}+Z_{2p}+Z_{2n}$) and the impedance between $V_{-p}$ and $V_{-n}$ is $2Z_1$ (i.e. $Z_{1p}+Z_{1n}$). Since the voltages in a voltage divider are proportional to the impedances, the negative differential input voltage is:

$$ΔV_- = ΔV_o \left( \frac{Z_1}{Z_1 + Z_2} \right) \quad (4)$$

Substituting equation (4) into equation (2) and rearranging the resultant equation gives:

$$ΔV_o = \left( \frac{Z_1 + Z_2}{Z_1} \right) \left( \frac{A}{A + \left( \frac{Z_1 + Z_2}{Z_1} \right)} \right) (ΔV_1 + ΔV_2) \quad (5)$$

Since the amplifier 140 is a high gain stage (i.e. A approaches infinity), the impedance component of the second term of equation (5) can be neglected, which reduces the second term to one. Thus, the final differential output is defined by:

$$ΔV_o = \frac{Z_1 + Z_2}{Z_1}(ΔV_1 + ΔV_2) \quad (6)$$

Equation (6) no longer shows the negative different input voltage ΔV− element as it is completely determined by the feedback loop (i.e. the output voltage and the voltage divider impedances). Further, due to the gain setting circuit 150, no resistors are needed to be connected to the signal paths to set the gain of the DDFA 130 thereby resulting in low noise in the overall downconverter.

Figure 6:
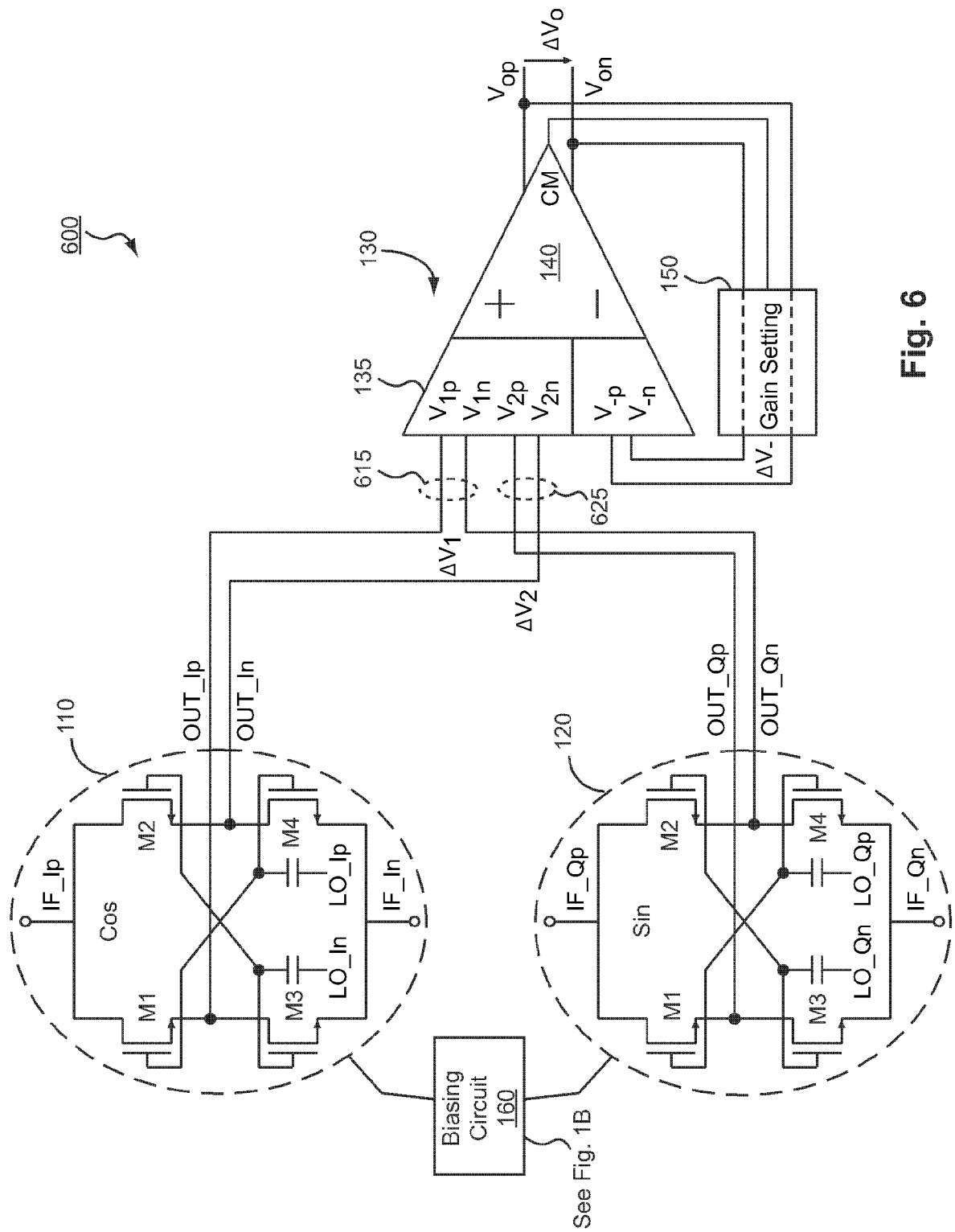
FIG. 6 shows a schematic diagram of a signal downconverter according to an alternative embodiment of the present invention.

In accordance with an alternative embodiment, FIG. 6 shows a schematic diagram of a signal downconverter 600. The elements and operations thereof of the signal downconverter 600 are similar to those of the signal downconverter 100 of FIG. 1A with exception that the outputs from the cosine mixer 110 and sine mixer 120 are coupled to the differential input stage 135 differently as shown in FIG. 6. In this alternative embodiment, the first differential input 615 is made of voltage OUT_Ip from the cosine mixer 110 and voltage OUT_Qn from the sine mixer 120. The second differential input 625 is made of voltage OUT_Qp from the sine mixer 120 and voltage OUT_In from the cosine mixer 110. With this input voltages configuration, the differential input stage 135 is insensitive to the common mode ripples of the input voltages. Due to this common mode rejection, no high frequency ripples are produced in the current summing buses. In contrast, the current summing buses of the signal downconverter 100 (of FIG. 1A) cancel the high frequency ripples. Accordingly, the resultant vector at the input of the high gain stage 140 is the same as equation (6) in the foregoing.

Figure 7:
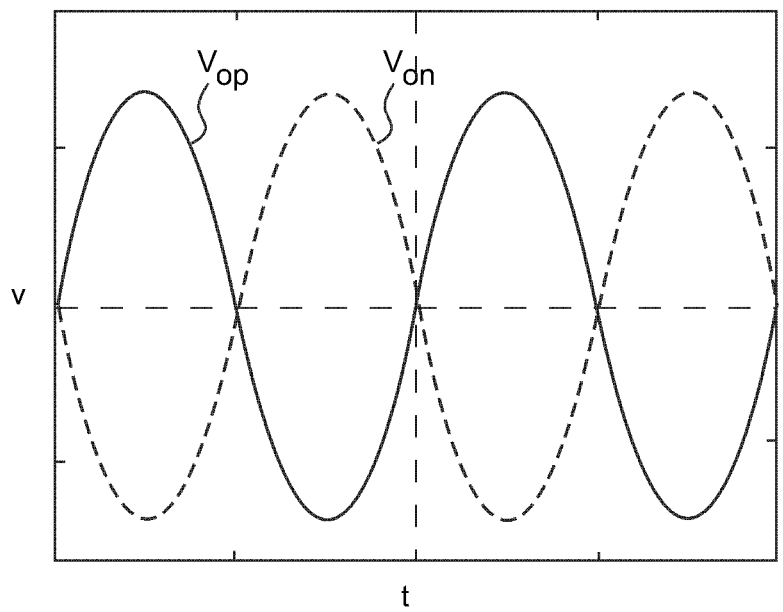
FIG. 7 shows exemplary waveforms at the output of the signal downconverter.

FIG. 7 shows exemplary waveforms at the output of the signal downconverters 100, 600 according to the embodiments described in the foregoing. The waveforms, $V_{op}$ and $V_{on}$, are down converted signals free of unwanted signals.

The present invention is described in terms of particular arrangements, elements and methods for convenience of explanation and is not intended to be limiting. A person skilled in the art will understand based on the description herein that the present invention applies to other arrangements, choices of elements and other methods that accomplish substantially the same result in substantially the same way. For example, the signal downconverters described in the foregoing can be realised using discrete electronic components or CMOS technology and the like semiconductor processing technologies or a combination thereof.

The invention claimed is:

1. A signal downconverter comprising:
    a first and second mixer for receiving and mixing radio frequency signals to provide a first and second mixed differential signal, each mixed differential signal having a low and a high frequency component; and
    an amplifier coupled to the first and second mixer for receiving the mixed differential signals and further processing the mixed differential signals to provide a down converted signals free of the high frequency component, wherein the amplifier is a differential difference amplifier having a pair of differential inputs for receiving the first and second mixed differential signals, and wherein the differential difference amplifier comprises a differential input stage for receiving the first and second mixed differential signals, a high gain amplifier coupled to the differential input stage and a negative differential feedback loop coupling the outputs of the high gain amplifier to the differential input stage.

2. The signal downconverter of claim 1, wherein each of the first and second mixer is a double sideband mixer.

3. The signal downconverter of claim 1, wherein each of the first and second mixer is a double sideband passive mixer.

4. A signal downconverter comprising:
a first and second mixer for receiving and mixing radio frequency signals to provide a first and second mixed differential signal, each mixed differential signal having a low and a high frequency component; and
an amplifier coupled to the first and second mixer for receiving the mixed differential signals and further processing the mixed differential signals to provide a down converted signals free of the high frequency component, wherein each of the first and second mixer comprises four field effect transistors (FETs) M1, M2, M3 and M4 connected in a ring configuration, the drain terminals of a first pair of FETs M1, M2 being for receiving a first RE signal and the source terminals of a second pair of FETs M3, M4 being for receiving a second RF signal which is complementary to the first RF signal, the gate terminals of FETs M1, M4 being driven by a first local oscillator signal, the gate terminals of FETs M2, M3 being driven by a second local oscillator signal which is complementary to the first local oscillator signal, the source terminal of FET M1 being coupled to the drain terminal of FET M3 to provide a first mixed signal and the source terminal of FET M2 being coupled to the drain terminal of FET M4 to provide a second mixed signal, the first and second mixed signals forming a mixed differential signal.

5. The signal downconverter of claim 4, wherein each FET being a NMOS FET.

6. The signal downconverter of claim 4, wherein each FET being a PMOS FET.

7. The signal downconverter of claim 4, wherein the first mixer being a cosine mixer with the first RF signal provided thereto being an I-channel signal, the second mixer being a sine mixer with the first RE signal provided thereto being a Q-channel signal, the high frequency component of the first mixed signal from each mixer having substantially a 180 degrees phase shift in relation to each other and the high frequency component of the second mixed signal from each mixer having substantially a 180 degrees phase shift in relation to each other.

8. The signal downconverter of claim 7, wherein the amplifier is a differential difference feedback amplifier, the differential difference feedback amplifier comprising a differential input stage and a high gain amplifier coupled to thereto having a positive and negative output and a gain setting circuit acting as a negative feedback loop for the high gain amplifier by providing a differential feedback voltage to the differential input stage.

9. The signal downconverter of claim 8, wherein the differential input stage comprises a first portion having at least a pair of differential voltage inputs for receiving the mixed differential signals and a second portion having a differential voltage input for receiving the differential feedback voltage, a voltage to current converter for converting the differential voltages into corresponding differential currents and a differential current summing bus for performing vector operation on the differential currents.

10. The signal downconverter of claim 9, wherein the gain setting circuit comprises a voltage divider having first and second impedances $Z_1$ and $Z_2$ for providing the differential feedback voltage $\Delta V-$ defined by:

$$\Delta V_- = \Delta V_o \left( \frac{Z_1}{Z_1 + Z_2} \right)$$

where $\Delta V_o$ being a differential output voltage of the positive and negative outputs of the high gain amplifier.

11. The signal downconverter of claim 9, wherein the gain setting circuit comprises:
a first and second voltage divider,
each voltage divider comprising a first and second impedance, $Z_1$ and $Z_2$, $Z_1$ and $Z_2$ being connected in series,
the positive output of the high gain amplifier being coupled to one end of the first voltage divider and a divided voltage thereof being coupled to a positive input of the differential voltage input of the second portion of the differential input stage,
the negative output of the high gain amplifier being coupled to one end of the second voltage divider and a divided voltage thereof being coupled to a negative input of the differential voltage input of the second portion of the differential input stage, and the remaining free ends of the first and second voltage divider being coupled together.

12. The signal downconverter of claim 11, wherein coupling the remaining free ends of the first and second voltage divider together being further coupled to a common mode output of the high gain amplifier.

13. The signal downconverter of claim 11, wherein the first mixed differential signal $\Delta V_1$ from the first mixer and the second mixed differential signal $\Delta V_2$ from the second mixer being coupled to the first portion of the differential input stage such that the differential output voltage $\Delta V_o$ from the high gain amplifier being defined by:

$$\Delta V_0 = \frac{Z_1 + Z_2}{Z_1} (\Delta V_1 + \Delta V_2)$$

14. The signal downconverter of claim 11, wherein the first and second mixed differential signals being respectively coupled to first and second differential voltage inputs of the first portion of the differential input stage.

15. The signal downconverter of claim 11, wherein the first mixed signal from the first mixer and the second mixed signal from the second mixer form the first mixed differential signal and being coupled to a first differential voltage input of the first portion of the differential input stage, the second mixed signal from the first mixer and the first mixed signal from the second mixer form the second mixed differential signal and being coupled to a second differential input of the first portion of the differential input stage.

16. An integrated circuit structure having a signal downconverter formed as a part thereof, the signal downconverter comprising:
a first and second double sideband passive mixer for receiving differential input signals and producing mixed differential signals, each mixed differential signal having low and high frequency components; and
an amplifier coupled to the first and second mixer to collectively form a single sideband mixer, the output of which being a differential output signal free of the high frequency component, wherein the amplifier being a differential difference amplifier comprising a differential input stage for receiving the mixed differential signals and eliminating common mode components thereof and a high gain stage coupled to the differential input stage for amplifying signals therefrom to provide the differential output signal, and wherein the differential difference amplifier further comprising a gain setting circuit acting as negative feedback for affecting the overall gain of the differential difference amplifier, the gain setting circuit comprising a voltage divider coupling the differential output signal to the differential input stage.

* * * * *